(12) United States Patent
McDowell

(10) Patent No.: US 11,006,536 B2
(45) Date of Patent: May 11, 2021

(54) DEPLOYABLE HARDENED HOUSING UNITS

(71) Applicant: CACI, Inc.—Federal, Arlington, VA (US)

(72) Inventor: David McDowell, Arlington, VA (US)

(73) Assignee: CACI, Inc.—Federal, Arlington, VA (US)

( * ) Notice: Subject to any disclaimer, the term of this patent is extended or adjusted under 35 U.S.C. 154(b) by 0 days.

(21) Appl. No.: 16/836,023

(22) Filed: Mar. 31, 2020

(65) Prior Publication Data

US 2020/0367375 A1    Nov. 19, 2020

Related U.S. Application Data

(63) Continuation of application No. 16/508,225, filed on Jul. 10, 2019, now Pat. No. 10,653,022.

(60) Provisional application No. 62/729,336, filed on Sep. 10, 2018.

(51) Int. Cl.
| | |
|---|---|
| *H05K 5/02* | (2006.01) |
| *F16F 15/02* | (2006.01) |
| *H05K 7/20* | (2006.01) |
| *H05K 5/04* | (2006.01) |
| *H05K 5/06* | (2006.01) |

(52) U.S. Cl.
CPC ........... *H05K 5/0213* (2013.01); *F16F 15/02* (2013.01); *H05K 5/023* (2013.01); *H05K 5/0204* (2013.01); *H05K 5/0247* (2013.01); *H05K 7/20145* (2013.01); *H05K 7/20336* (2013.01); *H05K 5/04* (2013.01); *H05K 5/06* (2013.01)

(58) Field of Classification Search
CPC combination set(s) only.
See application file for complete search history.

(56) References Cited

U.S. PATENT DOCUMENTS

| | | | |
|---|---|---|---|
| 5,931,550 A | 8/1999 | Chen | |
| 7,969,746 B2 * | 6/2011 | Hoff | G06F 3/0416 361/807 |
| 8,397,842 B2 | 3/2013 | Gettings | |
| 8,432,668 B2 | 4/2013 | Li | |
| 9,050,888 B2 | 6/2015 | Gettings et al. | |
| 9,326,401 B2 * | 4/2016 | Duran | H05K 5/0226 |
| 9,750,145 B2 * | 8/2017 | Little | H05K 5/0247 |
| 10,365,699 B2 * | 7/2019 | Han | G06F 1/206 |
| 10,575,417 B2 * | 2/2020 | Sabbag | H04R 1/028 |

(Continued)

FOREIGN PATENT DOCUMENTS

| | | |
|---|---|---|
| EP | 0833552 A2 | 4/1998 |
| GB | 2356012 A | 5/2001 |

OTHER PUBLICATIONS

Coolermaster, "COSMOS II Ultra Tower", May 16, 2012, pp. 1-25.

*Primary Examiner* — Lisa Lea-Edmonds
(74) *Attorney, Agent, or Firm* — BakerHostetler

(57) ABSTRACT

The housing relates to apparatus, systems, and methods for robust, adaptable, and deployable computing devices and radio systems. An embodiment can be the housing for a C-sUAS that can be deployed to detect, identify, locate and defeat hostile sUASs and locate the sUAS operators and that can be ruggedized and efficiently deployed for use in various power- and space-constrained mobile platforms and at fixed locations. An embodiment can be housing for a C-sUAS that operates under severe environmental conditions.

18 Claims, 12 Drawing Sheets

(56) References Cited

U.S. PATENT DOCUMENTS

| | | |
|---|---|---|
| 10,653,022 B2 * | 5/2020 | McDowell ........... H05K 5/0204 |
| 2010/0085709 A1 | 4/2010 | Becklin |
| 2012/0020017 A1 | 1/2012 | Kehret et al. |
| 2013/0168058 A1 | 7/2013 | Chamseddine et al. |
| 2016/0057874 A1 | 2/2016 | Duran et al. |
| 2016/0129524 A1 | 5/2016 | Evans et al. |
| 2016/0330869 A1 * | 11/2016 | Williams ............. H05K 7/1474 |
| 2020/0084900 A1 * | 3/2020 | McDowell ........... H05K 5/0213 |

* cited by examiner

DEPLOYABLE HARDENED HOUSING UNITS

CLAIM OF PRIORITY

This application is a continuation of U.S. patent application Ser. No. 16/508,225, filed Jul. 10, 2019, which claims priority to U.S. Provisional Patent Application No. 62/729,336, filed Sep. 10, 2018, the contents of which are incorporated herein by reference in their entirety.

STATEMENT OF FEDERAL SUPPORT

This invention was made with the support of the U.S. government under Contract Number N4175617C4785 awarded by the U.S. Navy Engineering Logistics Office. The U.S. government has certain rights in this invention.

TECHNICAL FIELD

The present invention relates to apparatus, systems, and methods for robust, adaptable, and deployable computing devices and radio systems.

BACKGROUND

Computers and radio-based devices can be found in a wide variety of applications. For example, radio stations can be stand-alone installations that take up entire dedicated buildings. Other radio-based devices, such as mobile phones, can fit in our pockets. Computers can range from large mainframes and server farms, filling up warehouses, to laptops and mobile phones. Computers and radio-based devices can be utilized in various environments and theaters. Computers and radio-based systems for detection and mitigation of small unmanned aerial vehicles (UAVs) have become increasingly important. UAVs—termed small unmanned aircraft systems (sUASs) by the U.S. Department of Defense and the Federal Aviation Administration, and commonly called drones—have proliferated in recent years. Inadvertent or unlawful misuse of sUASs poses an escalating threat to public safety. Particular safety challenges can include sUASs intruding into restricted airspace around high-value assets such as airports, buildings, critical national infrastructure, and stadiums, as well as hindering military and first responder activities.

SkyTracker® is a suite of sophisticated counter-small unmanned aircraft systems (C-sUAS), offered by CACI, an industry leader in developing, deploying, and integrating systems of this nature. The SkyTracker suite is comprised of different form factors designed to exploit the radio communication between sUASs and their controller. CACI's integrated system-of-systems approach, combined with precision detection, location, identification, tracking, and mitigation techniques, has for many years provided solutions necessary to counter evolving sUAS threats and to protect the warfighter, critical national security assets and infrastructure, as well as the national airspace. For example, the SkyTracker suite includes CORIAN™, which provides the warfighter fixed site force protection against sUAS threats.

SUMMARY

The present invention is generally directed to housings for computers, radios, and electronic componentry. An embodiment can be the housing for a C-sUAS that can be deployed to detect, identify, locate and defeat hostile sUASs and locate the sUAS operators. C-sUAS can be installed with and integrated with other computer and radio-based devices in space-, weight-, and power constrained environments on various mobile platforms (e.g., ships, HUMVEES, and sport utility vehicles (SUVs)) and at fixed locations. C-sUAS can be transported, installed and operated under severe environmental conditions and under conditions where time is of the essence.

An embodiment can be ruggedized for use in severe environmental conditions and can include shock mounts and protrusions for efficient deployment of the C-sUAS. Embodiments can incorporate protrusions that have flexible mounting options that can be easily adapted for various fixed site and mobile platform configurations. An embodiment of the housing can have heat pipes that can be used in various weight-, power- and space-constrained mobile platforms and at fixed locations.

An aspect can include chassis for housing electronic componentry. The system can have a chassis frame. The chassis frame can have a top plate, a bottom plate, and a plurality of protrusions. The protrusions can extend beyond the top plate and the bottom plate. The system can have a first handle and a second handle. The handles can each be attached to two of the protrusions. The system can further include an interface panel and a back panel. The interface and back panels can be located on the chassis frame opposite one another. The system can include one or more vents.

In some embodiments, the chassis frame can have shock mounts, which can have bolt holes to facilitate securing the frame. The shock mounts can be a monolithic component of the chassis frame or, alternatively, can be removably attached to the frame, and/or part of a mounting rack for mounting a chassis frame.

In other embodiments, the system can include a plurality of heat pipes. The heat pipes can be in thermal contact with the top plate and/or with the back panel. In some embodiments, the system can include one or more heat sinks, with or without thermal communication to any heat pipes. The heat sinks can be with or without cooling fins. The heat sinks can be integral and/or monolithic components of the panels and/or plates of the system, and the heat sinks can be located on the inside and/or the outside of the chassis. In a preferred embodiment, the processor control unit (PCU) includes heat pipes, which can combine thermal conductivity and phase transitions to release heat produced by processors. The high temperature end of the heat pipes can be positioned so as to be in thermal contact with processors. The low temperature end of the heat pipes can be positioned so as to be in thermal contact with a side of the PCU. Alternatively, the low temperature end of the heat pipes can be in thermal contact with a heat sink. Heat pipes and/or heat sinks can obviate the need for fans or other electronics cooling systems which can decrease the size, weight, and power requirements of the SDR.

In yet other embodiments, the system can include one or more fans. Such fans can be configured to draw air into the system from a first vent and to expel air from the system through a second vent.

In some embodiments, the system can be configured to communicate via a wired interface to another chassis for housing electronic componentry. The system and/or the other chassis can further be configured to communicate via one or more antennae.

Another aspect can include a multi-chassis system for housing electronic componentry. The system can include a first and a second chassis frame, each having a top plate and a bottom plate as well as a back panel and an interface panel.

The first and second chassis frames can each have a plurality of protrusions that extend beyond the top and bottom plates. The chassis frames can each have at least two handles. The handles can each be attached to two of the protrusions. On each chassis, the respective back panel can be located on the chassis frame opposite the interface panel. Each interface panel can have a first port. Each of the first ports can be configured to be coupled via a wired communication link to one another.

In some embodiments, the wired communication link can be configured to carry communication signals between the interface panels. The wired communication link can also be configured to carry electric power from one interface panel to the other interface panel.

In other embodiments, an interface panel can include one or more Wi-Fi antenna ports. An interface panel can also include a high band antenna port, a low band antenna port, and/or a GPS antenna port.

In some embodiments, one or more of the chassis units of the multi-chassis system can include one or more vents. The chassis units can have one or more heat sinks. The chassis units can have heat pipes. The heat pipes can be in thermal contact with a heat sink. The heat pipes can be in thermal contact with a processor.

BRIEF DESCRIPTION OF THE DRAWINGS

The present invention is further described in the detailed description which follows, in reference to the noted plurality of drawings by way of non-limiting examples of certain embodiments of the present invention, in which like numerals represent like elements throughout the several views of the drawings, and wherein.

DETAILED DESCRIPTION

A detailed explanation of the system, method, and exemplary embodiments of the present invention are described below. Exemplary embodiments described, shown, and/or disclosed herein are not intended to limit the claims, but rather, are intended to instruct one of ordinary skill in the art as to various aspects of the invention. Other embodiments can be practiced and/or implemented without departing from the scope and spirit of the claimed invention.

Computers and radio-based devices often need to be deployed in harsh, dynamic, and unusual environments. For example, the Navy and Coast Guard increasingly use advanced computer systems and radio stations on ships that were built decades ago and in locations that make them prone to impacts and jostling. Operators can deploy systems in moving vehicles, temporary dwellings, and safe houses, none of which are ideal for computers and radio systems, which can include sensitive componentry. Accordingly, there is a need for robust and rugged systems for these and other harsh environments.

Although useful and adaptable for various computer and radio missions, embodiments can provide on-the-move force or fixed site protection against hostile sUAS. A ruggedized, mobile platform embodiment can precisely detect, identify, and/or mitigate sUAS threats via delivery of sophisticated non-kinetic, non-attributable effects. Systems can have reduced size, weight, and power requirements and can be easily deployed in space-, weight-, and power-constrained environments such as in vehicles and/or maritime vessels.

Embodiments can have protrusions, shock mounts, handles, and heat pipes that can allow computer and radio-based devices to be ruggedized and efficiently deployed. For example, some embodiments can be housing for C-sUAS that can be installed in under one hour in a vehicle, such as a sport utility vehicle (SUV), a HUMVEE, or a maritime vessel and can allow real-time situational awareness (SA) of a hostile sUAS threat. It can be ruggedized yet light enough for a two-person lift, and it can operate under severe environmental conditions, such as large temperature ranges (0° C. to 60° C.), rain, salt spray/fog, snow, and dust. Embodiments can incorporate protrusions that prevent damage to system exterior controls during transport, installation, and operation and have flexible mounting options that can be easily adapted for various fixed site and mobile platform configurations. A versatile power system can be capable of running off vehicle power, shore power, and/or optional battery pack. Embodiments can incorporate heat pipes that reduce size, weight, and power requirements of the computer or radio-based device.

Figure 1:
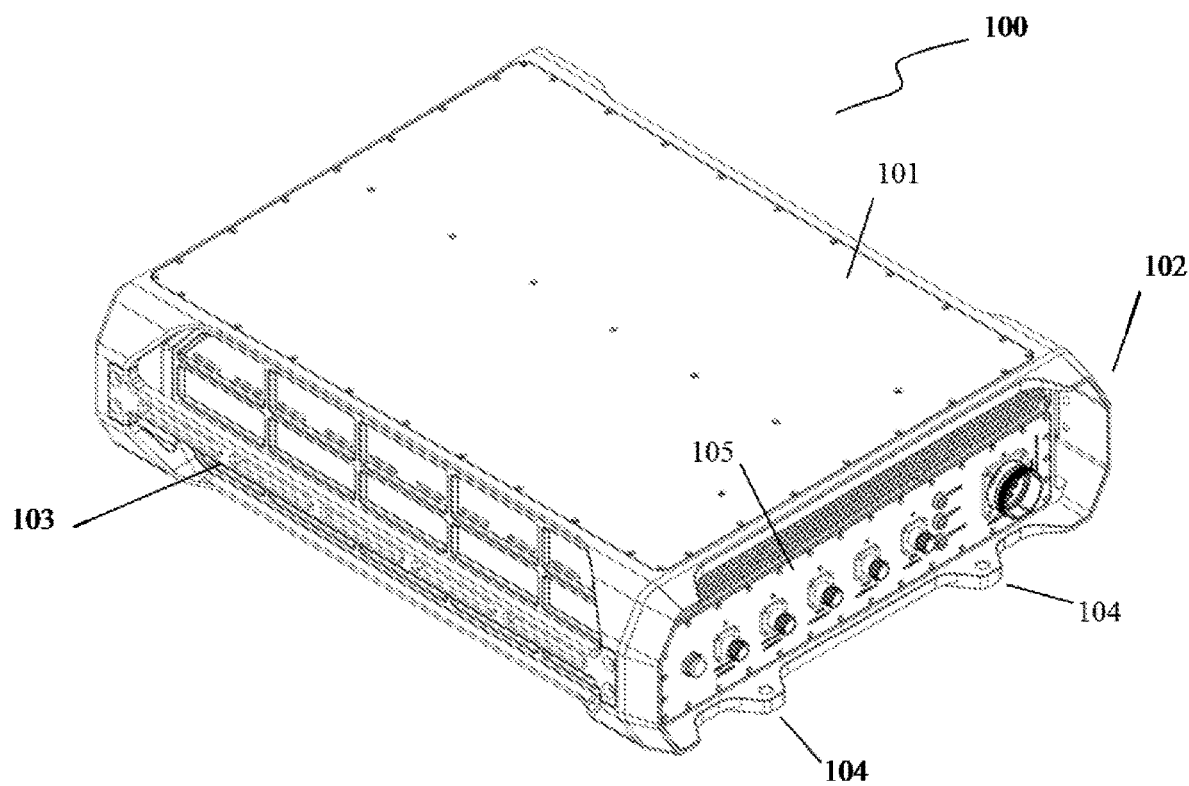
FIG. 1 illustrates a perspective view of an antenna interface unit chassis.
Figure 2:
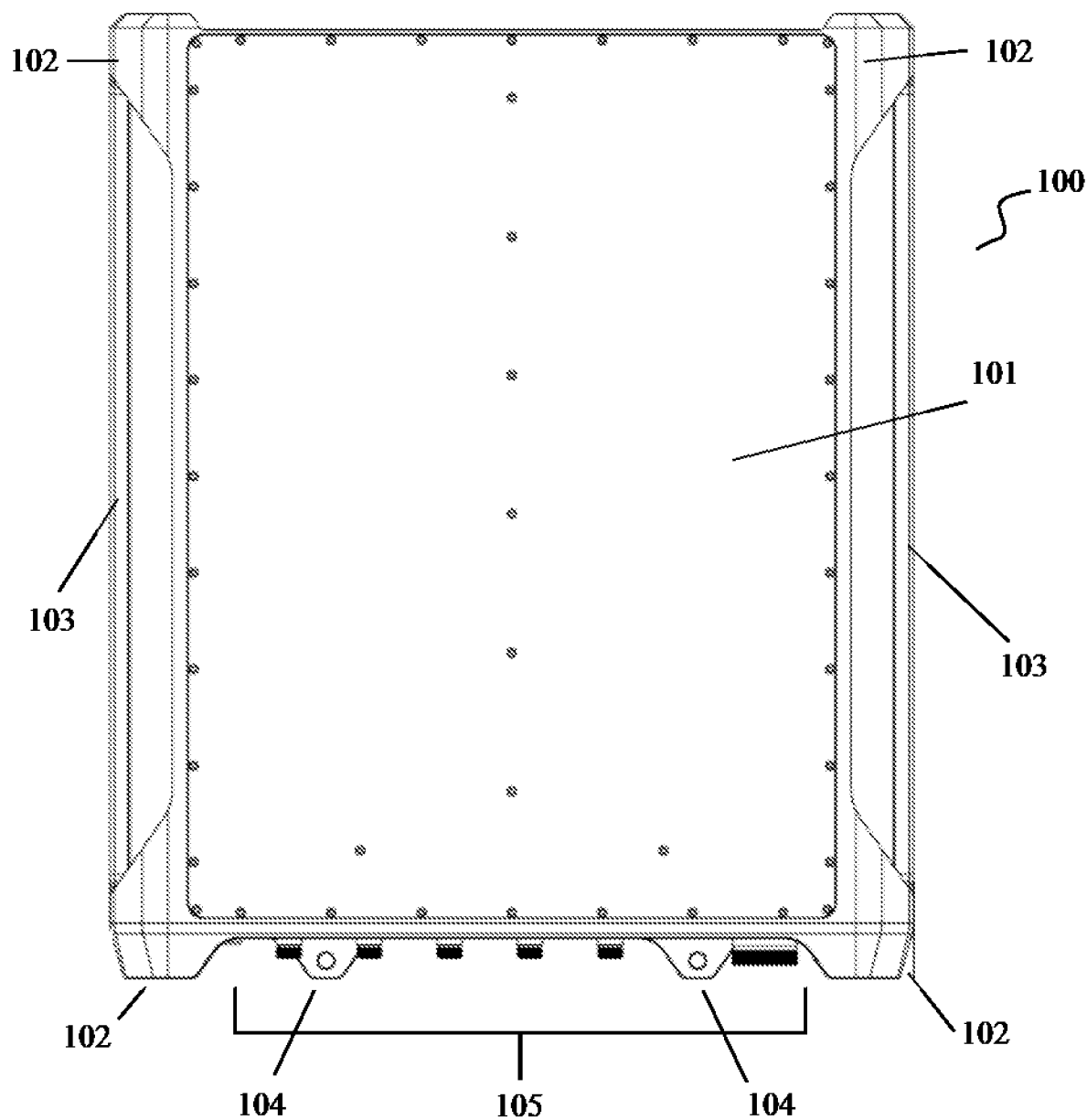
FIG. 2 illustrates an overhead view of an antenna interface unit chassis.
Figure 3:
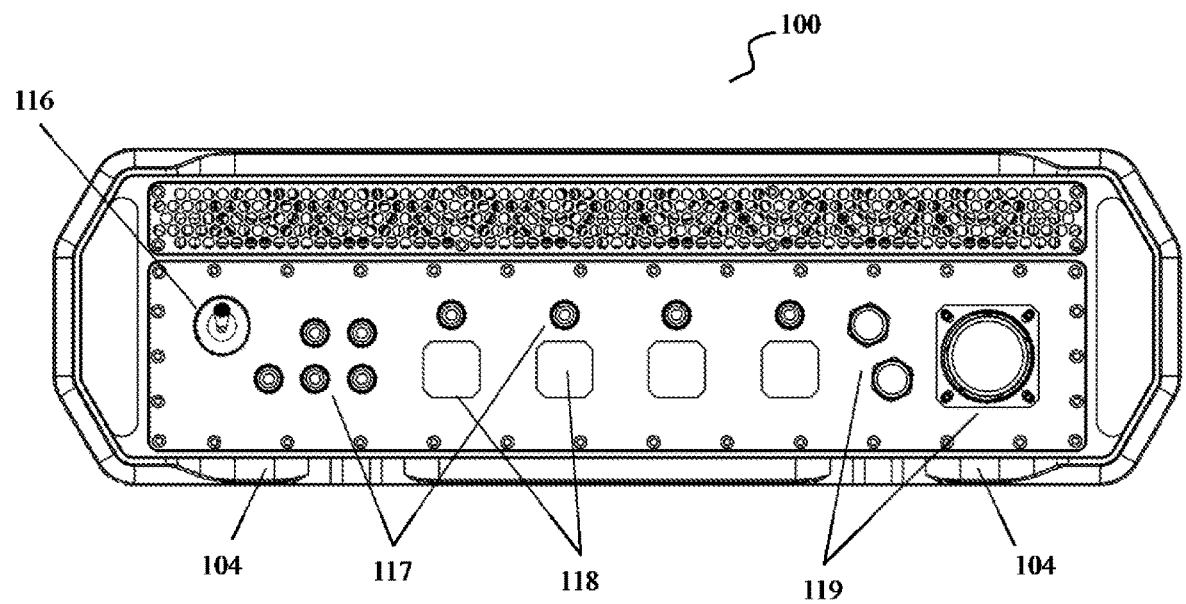
FIG. 3 illustrates an interface panel of an antenna interface unit chassis.
Figure 4:
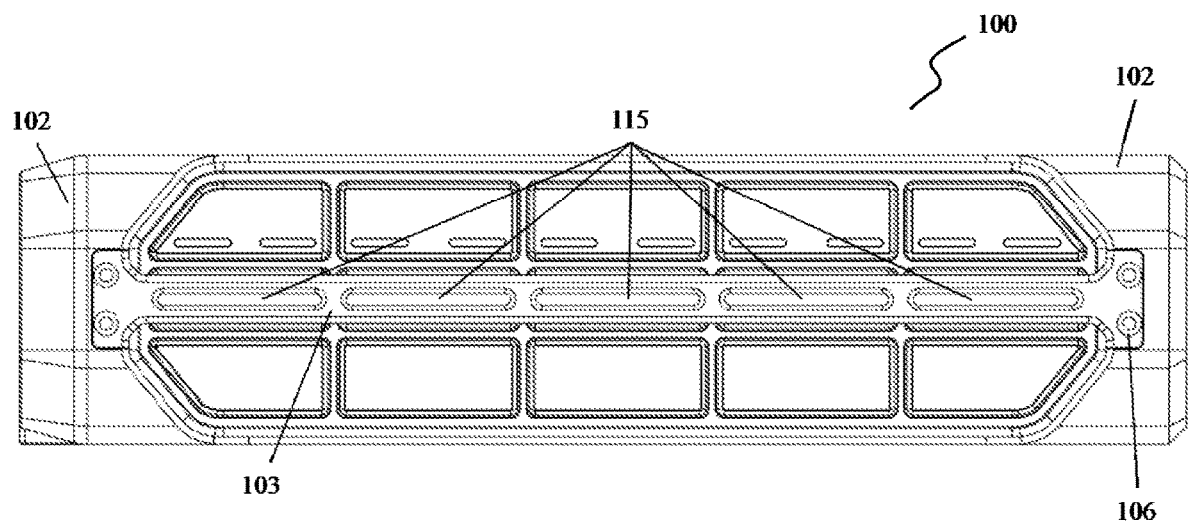
FIG. 4 illustrates a side-view of an antenna interface unit chassis.

FIGS. 1-5 illustrate a chassis for an antenna interface unit (AIU, 100). The AIU chassis can include a top plate (101) and a bottom plate (not shown). The AIU chassis can include protective protrusions (102) at each of its four corners. Handles (103) can be attached to the side of the chassis at the protrusions to facilitate carrying of the AIU. FIG. 2 shows how handles (103) can be located at the outside of the protrusions to provide a distance from the AIU. FIG. 4 shows the handles attached by rivets or bolts (106). Handles (103) can provide further protection of the AIU and can be used with tie-downs to secure the AIU. The handles can include a series of slots (115) as shown in FIG. 4. The slots can be utilized with a plurality of straps, which can be fed through the slots to further secure the AIU.

Figure 5:
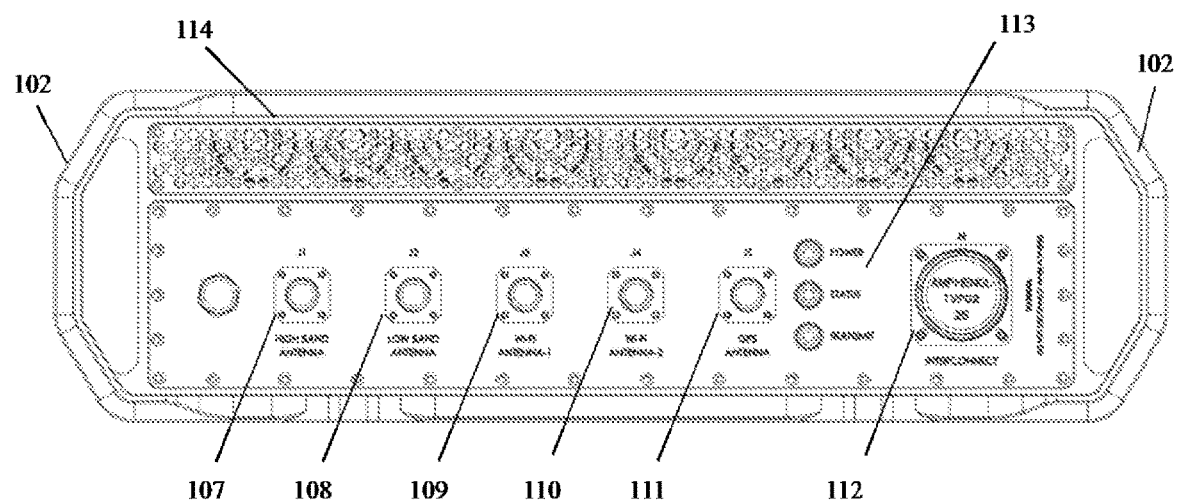
FIG. 5 illustrates an interface panel of an antenna interface unit chassis.

Protrusions (102) can be shaped, for example as shown in FIG. 5, to facilitate sliding the AIU chassis into and out of mounting racks (not shown). The mounting rack can have a correspondingly shaped slot to accept the AIU chassis and secure the chassis from vertical and horizontal movement.

The corners of the protrusions can be faceted, for example as shown in FIG. 4, to facilitate easier installation of the chassis in the mounting rack.

Shock mounts (104) can be located at various positions about the AIU chassis. The shock mounts can include bolt holes to facilitate hard mounting the AIU chassis. The AIU can be mounted in any orientation, which can allow the AIU to be located out of the way, such as vertically mounted on a wall or a ceiling, was well as in discrete or surreptitious locations. Compressible grommets can be placed between the shock mounts and the mounting surface to further protect the electronic componentry of the AIU. In an embodiment, three or more shock mounts can be utilized to secure the AIU to a vehicle. Shock mounts can include compressible grommets, springs, and/or spacers, as well as, or alternatively, hydraulic or gas springs or shocks or other vibration or shock-isolating componentry.

Interface panel (105) of the AIU can be configured according to user preference and/or specific applications and/or requirements. FIG. 3 illustrates an interface panel in an embodiment of the AIU chassis. The AIU interface panel can include a power switch or toggle (116). Lights (117) on the interface panel can indicate various status data. The lights can be general system indicators and/or indicators associated with specific ports (118). Dedicated ports (118) can be included on the interface panel for communicating according to specific standards and/or supporting peripheral devices. A port can be dedicated for powering the AIU. Other interface ports and jacks (119) can also be included.

FIG. 5 illustrates another embodiment of the AIU chassis. According to this embodiment, the interface panel can include a port for connecting to a high band antenna (107) and a port for connecting to a low band antenna (108). The chassis can include a plurality of Wi-Fi antennae. As shown, the AIU can connect to Wi-Fi Antenna 1 (109) and Wi-Fi Antenna 2 (110). The AIU can also include a port for connecting to an antenna for satellite-based geolocation. Here, GPS (Global Positioning System) is given as an example, but the system can utilize one or more other geolocation satellite systems, such as GLONASS, Galileo, BeiDou-2, and others. The AIU chassis can further include a cable or multi-cable interface connection (112), for example to facilitate communications with a computer controller. The AIU chassis can include indicator lights (113), which as an example are shown as power, status, and transmission indicators. The AIU chassis can include one or more cooling vents. As shown in the figure, the vent can be constructed of a sheet of strong material, such as metal, having a pattern of holes to allow air to vent. The vent also, or alternatively, can include a screen and/or filter. The vents can include high-flow, replaceable filter cartridges.

Figure 6:
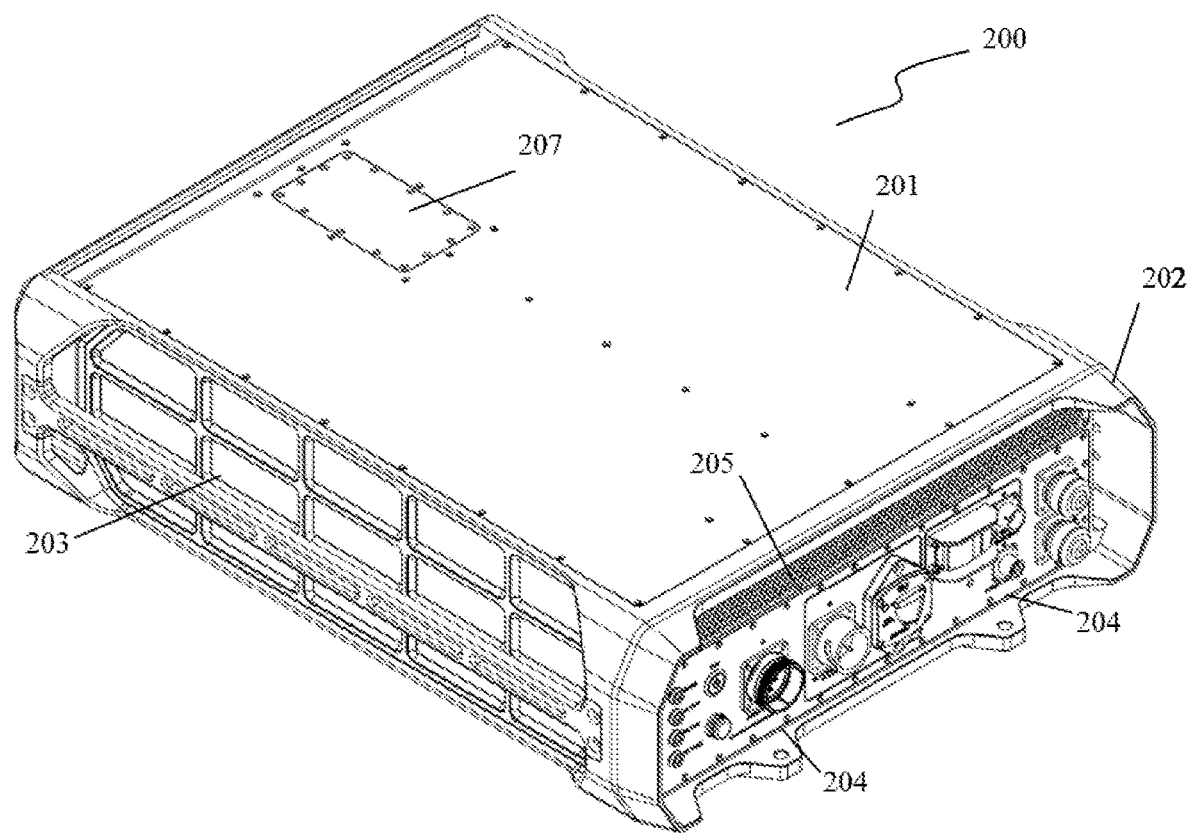
FIG. 6 illustrates a perspective view of a processor control unit chassis.
Figure 7:
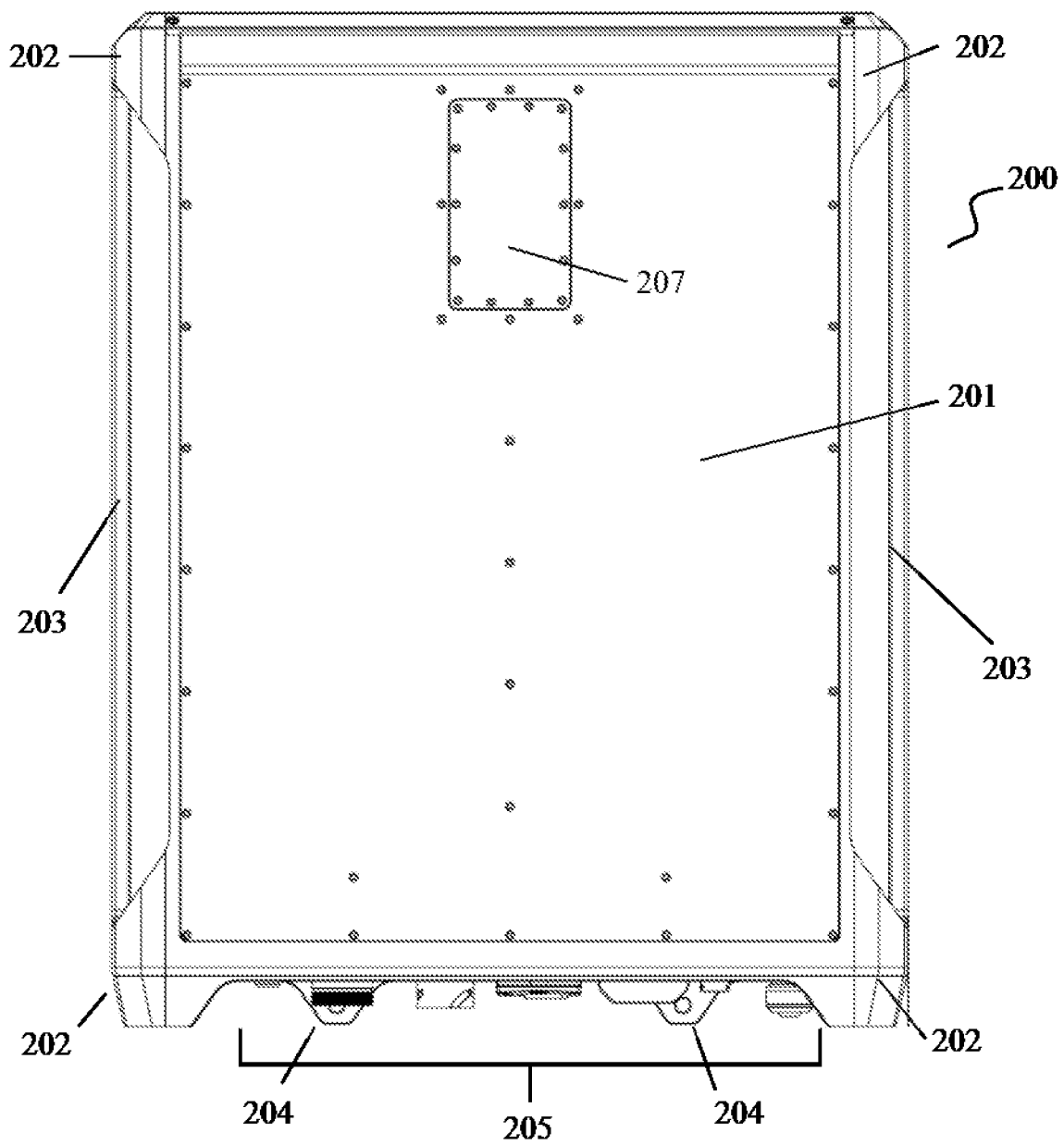
FIG. 7 illustrates an overhead view of a processor control unit chassis.
Figure 8:
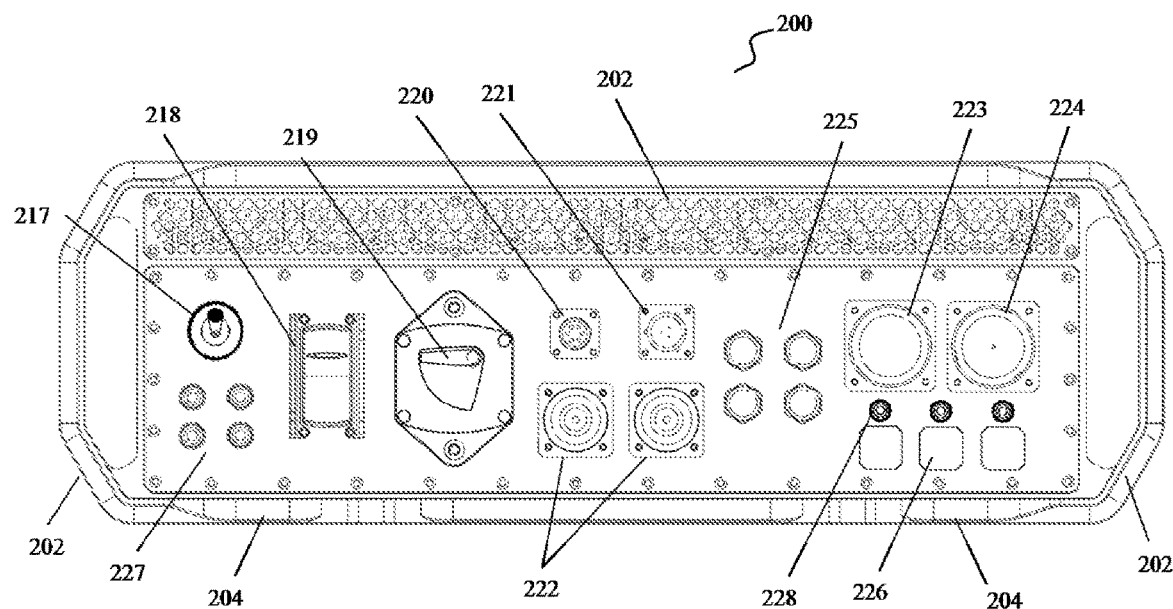
FIG. 8 illustrates an interface panel of a processor control unit chassis.
Figure 9:
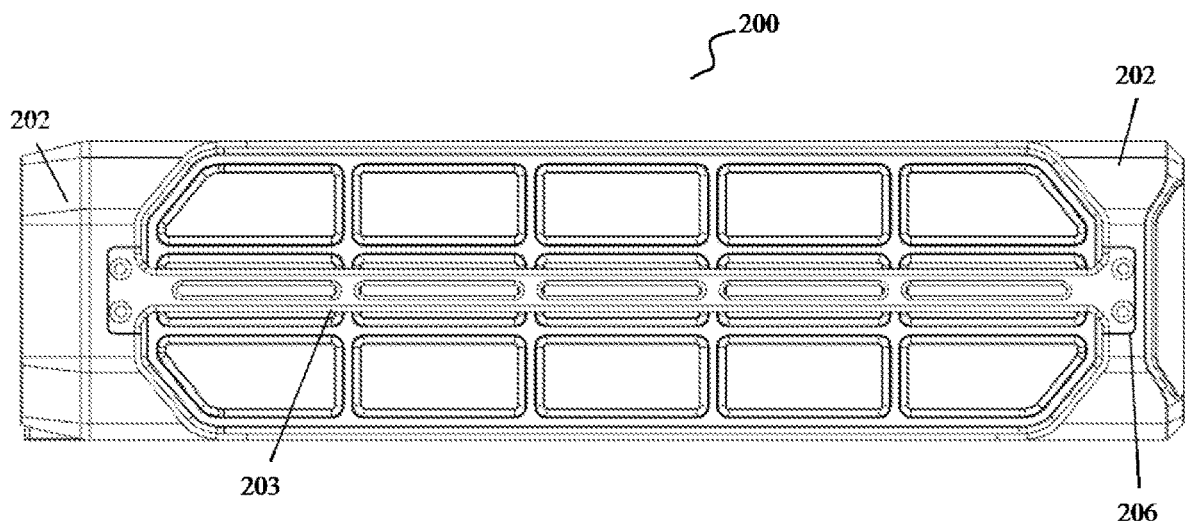
FIG. 9 illustrates a side-view of a processor control unit chassis.

FIGS. 6-10 illustrate a chassis for a processor control unit (PCU, 200). The PCU chassis can include a top plate (201) and a bottom plate (not shown). The PCU chassis can include protective protrusions (202) at each of its four corners. Handles (203) can be attached to the side of the chassis at the protrusions to facilitate carrying of the PCU. FIG. 7 shows how handles (203) can be located at the outside of the protrusions to provide a distance from the PCU. FIG. 9 shows the handles attached by rivets or bolts (206). Handles (203) can provide further protection of the PCU and can be used with tie-downs to secure the PCU. The handles can include a series of slots as shown in FIGS. 6 and 9. The slots can be utilized with a plurality of straps, which can be fed through the slots to further secure the PCU.

Protrusions (202) can be shaped, for example as shown in FIG. 8, to facilitate sliding the PCU chassis into and out of mounting racks (not shown). The mounting rack can have a correspondingly shaped slot to accept the PCU chassis and secure the chassis from vertical and horizontal movement. The corners of the protrusions can be faceted, for example as shown in FIG. 9, to facilitate easier installation of the chassis in the mounting rack.

Shock mounts (204) can be located at various positions about the PCU chassis. The shock mounts can include bolt holes to facilitate hard mounting the PCU chassis. The PCU can be mounted in any orientation, which can allow the PCU to be located out of the way, such as vertically mounted on a wall or a ceiling, was well as in discrete or surreptitious locations. Compressible grommets can be placed between the shock mounts and the mounting surface to further protect the electronic componentry of the PCU. In an embodiment, three or more shock mounts and compressible grommets can be utilized to secure the PCU to a vehicle.

Interface panel (205) of the PCU can be configured according to user preference and/or specific applications and/or requirements. FIG. 8 illustrates an interface panel in an embodiment of the PCU chassis. The PCU interface panel can include a power switch and/or toggle (217) and/or one or more breakers (218, 219). Lights (227, 228) on the interface panel can indicate various status data. The interface panel lights can be general system indicators and/or indicators associated with configurable ports (226). Interface ports can be multi-pin ports (220, 221), axial ports (224), and/or multi-axial ports (222) can also be included. Other port types can be included on the interface panel, such as jacks (223, 225) and/or ports for interfacing with peripheral devices.

Figure 10:
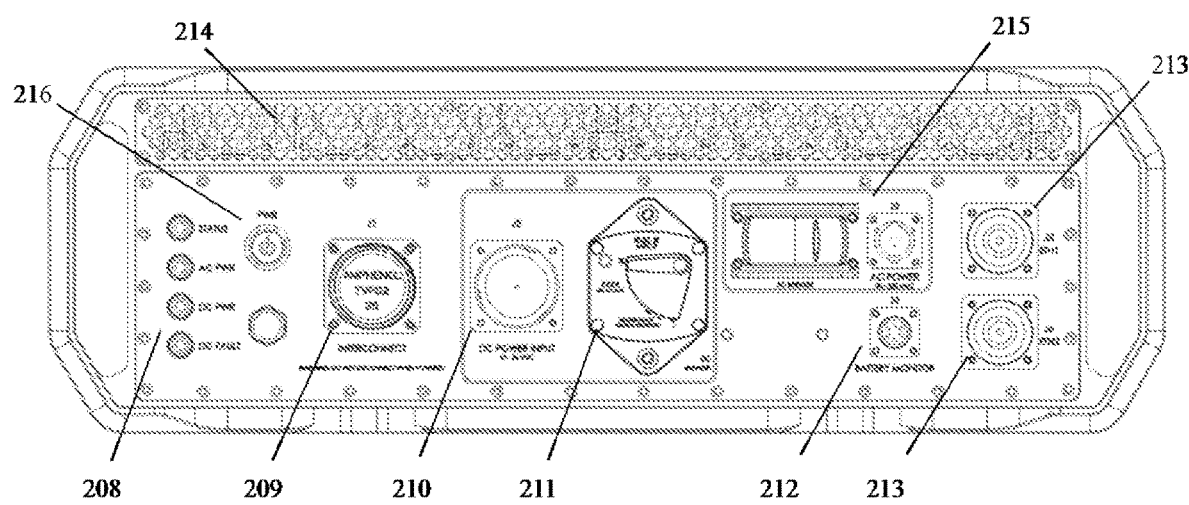
FIG. 10 illustrates an interface panel of a processor control unit chassis.

FIG. 10 illustrates another embodiment of the PCU chassis. According to this embodiment, the PCU chassis can include indicator lights (208), which as an example are shown as indicators of status, power from alternating current (AC), power from direct current (DC), and fault in the DC power. Power can be supplied via AC power connector at the AC circuit breaker assembly (215) and/or via DC power at the DC power input (210) at the DC circuit breaker (211). The PCU can be turned on and off via power switch (216). The PCU chassis can include one or more cooling vents (214). As shown in the figure, the vent can be constructed of a sheet of strong material, such as metal, having a pattern of holes to allow air to vent. The vents also, or alternatively, can include screens and/or filters, such as high-flow, replaceable filter cartridges. The interface panel (205) of the PCU can include a cable or multi-cable interface connection or interconnect (209), as well as Ethernet ports (213), and/or a battery monitor port (212). The interconnect can, for example, facilitate communications with an antenna interface unit.

Figure 11:
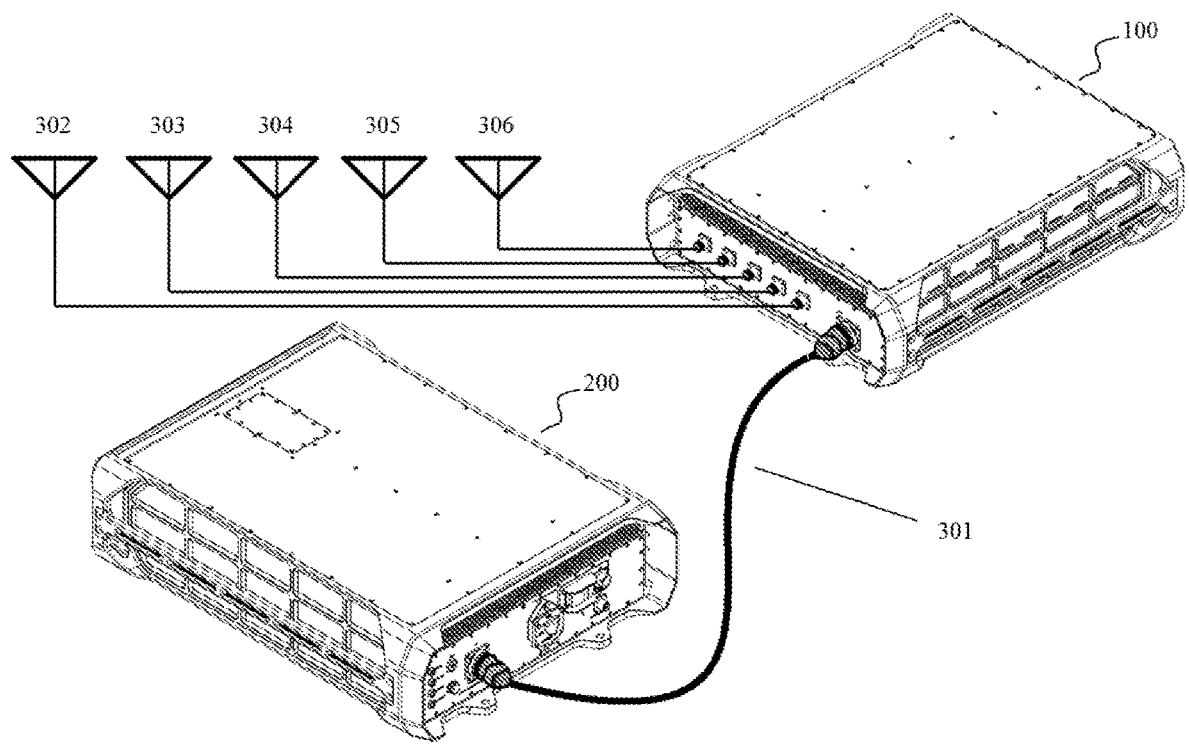
FIG. 11 illustrates a radio system embodiment.

FIG. 11 illustrates a system that can include an AIU (100) and a PCU (200). The AIU and PCU can be interconnected via interface cable (301). The interface cable can be of various lengths to facilitate on-site configuration of the AIU/PCU system. For example, the interface cable can be a meter or two, or the interface cable can be several tens of meters. The AIU can be communicatively connected to antennae (302-306). For example, in an embodiment, the AIU can be connected to high band antenna (302), low band antenna (303), a first Wi-Fi antenna (304), a second Wi-Fi antenna (305), and a GPS antenna (306). Connecting the separate units via the interface cable can allow the AIU to be placed nearer the antennae than the PCU. This can facilitate locating the PCU in a cooler and/or more protected environment than the AIU. Whether the antennae are configured to communicate according to a digital or analog protocol, the physical communications themselves are necessarily analog in nature. Accordingly, locating the AIU nearer the antennae can also facilitate handling of analog signals at the point of reception or transmission, which can improve signal quality and reduce noise. Further, communication via the interface cable can be digital, either by conversion of analog signals to digital signals by the AIU or by digital signals sent from the PCU to the AIU, whether or not for subsequent conversion to analog.

Figure 12:
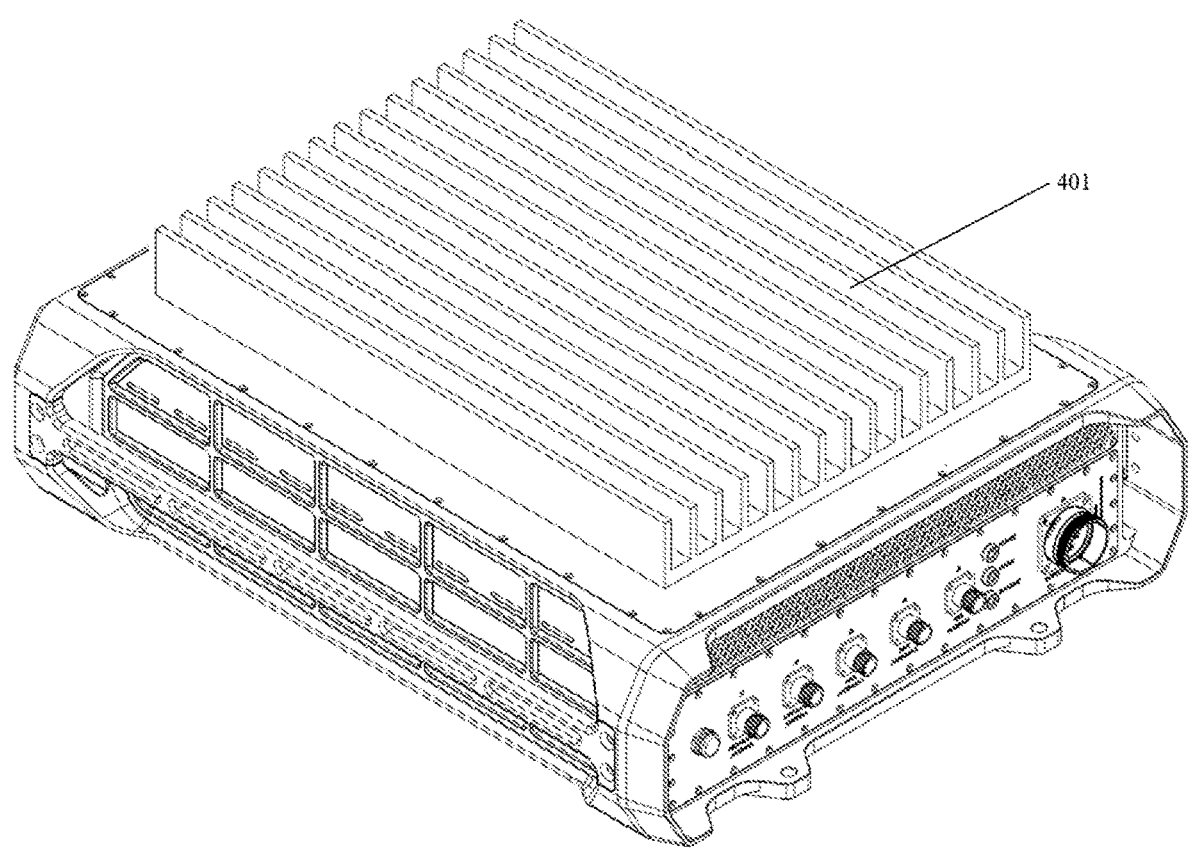
FIG. 12 illustrates an alternative embodiment of an antenna interface unit chassis.
Figure 13:
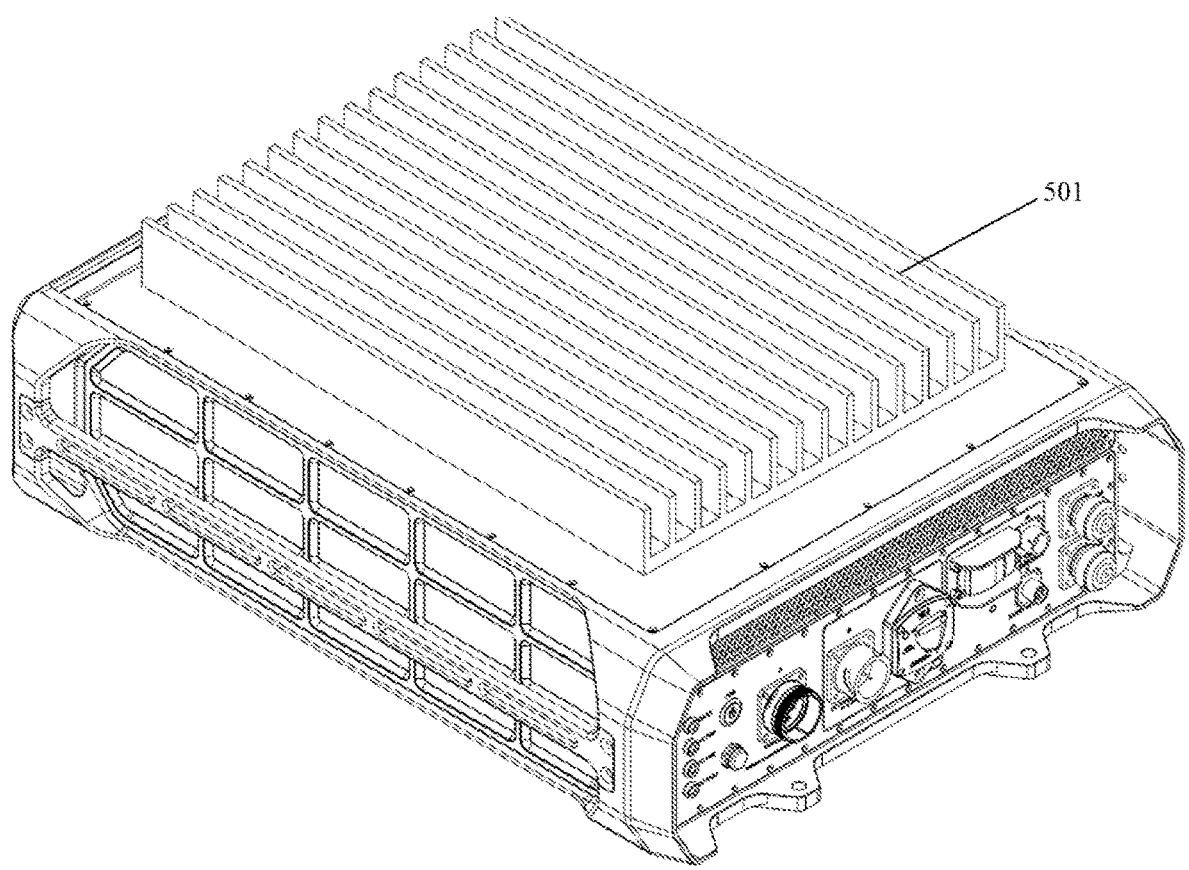
FIG. 13 illustrates an alternative embodiment of a processor control unit chassis.

Computers and radio equipment can generate significant heat. Prior solutions can require much more space and can be less efficient than implementations disclosed herein, and such electronics and radio systems were subject to failure without air conditioning to prevent overheating. The AIU and PCU chassis can advantageously include heat-transfer devices to dissipate such heat energy without air conditioning. For example, top plate (101, 201) can be a heat sink. The back panel can also be a heat sink. FIG. 12 illustrates an AIU chassis having an alternative AIU heatsink (401) with fins. Similarly, FIG. 13 illustrates a PCU having an alternative PCU heatsink (501) with fins. Embodiments can provide important advantages in cooling electronic and/or radio systems.

Figure 14:
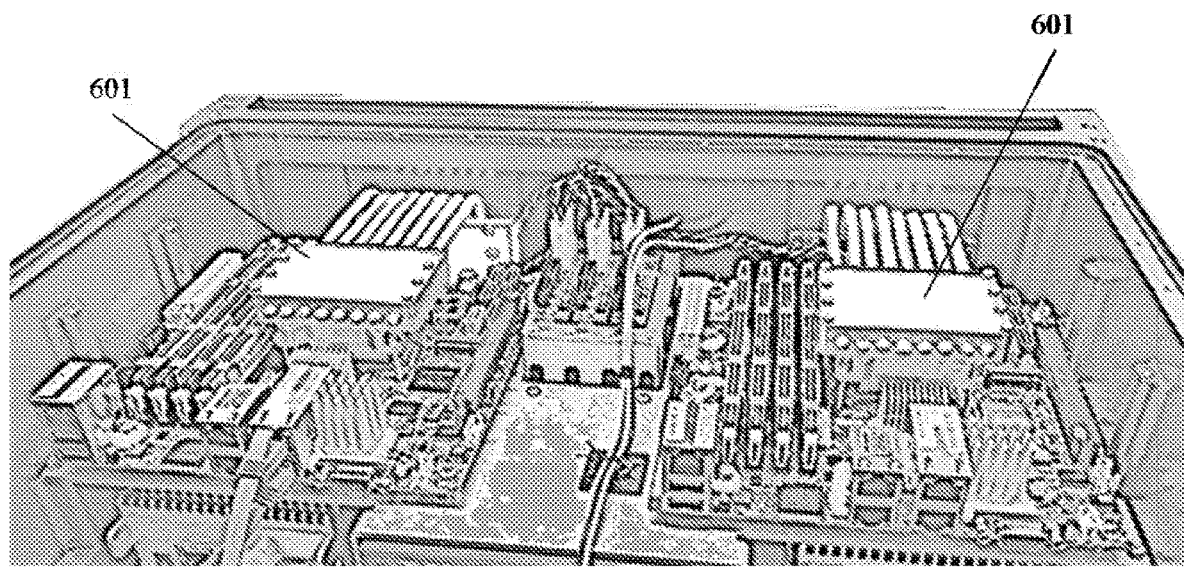
FIG. 14 illustrates an interior of a processor control unit having two sets of heat pipes.
Figure 15:
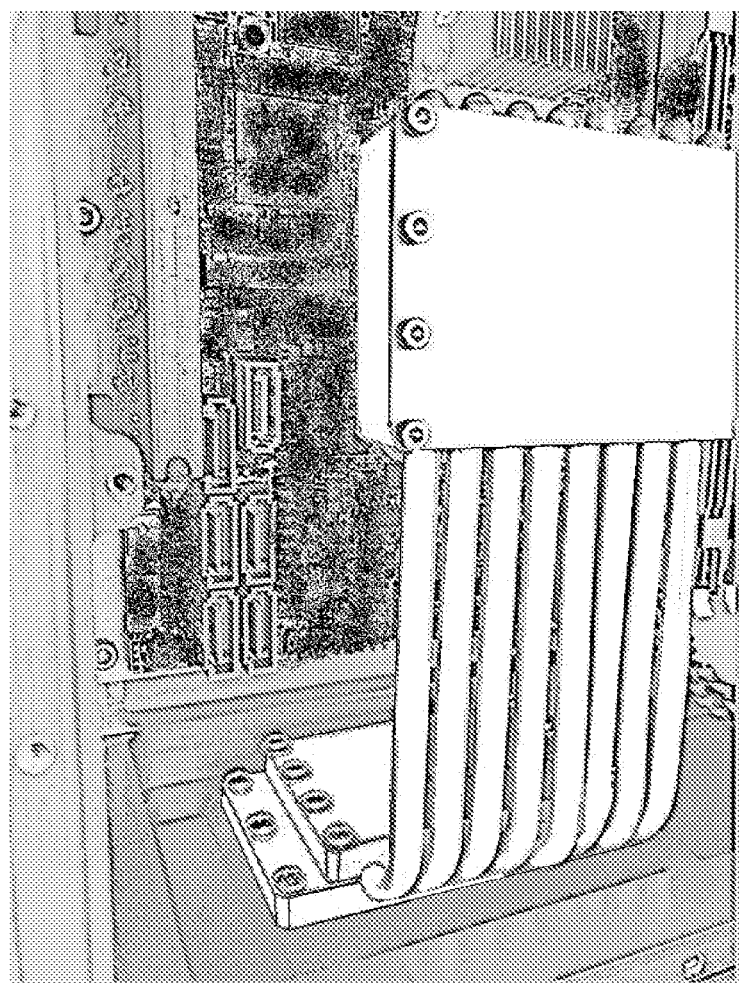
FIG. 15 illustrates heat pipes.

In a preferred embodiment, the PCU chassis includes heat pipes, which combine thermal conductivity and phase transitions to release heat produced by processors of the PCU. FIG. 14 illustrates the interior of a PCU chassis. The high temperature end of the heat pipes (601) can be positioned so as to be in thermal contact with processors. The low temperature end of the heat pipes can be positioned so as to be in thermal contact with the back side of the chassis, as shown for example in FIG. 15. Alternatively, the low temperature end of the heat pipes can be in thermal contact with a heat sink, such as top plate (101, 201) or, alternatively, the heat sinks of FIGS. 12 and/or 13. It should be understood that heat pipes can similarly be advantageously utilized in the AIU chassis.

The heat pipes and heat sinks discussed herein can obviate the need for fans. Fans can be employed to increase the rate of heat dissipation. In another embodiment, the heat sinks of FIGS. 12 and 13 can be disposed within the chassis, i.e. under the top plate (101, 201). Fans can draw air into the chassis from vents (114, 214) and blow air through the fins of the heat sink (401, 501), and air can exit the chassis through vents in the back plate of the chassis. Fans can be similarly employed without the need for finned heat sinks. In a preferred embodiment, the AIU chassis and the PCU chassis can each further include an internal plate below top plate (101, 201). The internal plate can hermetically seal the electronic componentry within the chassis, and can include a heatsink. Vents (114, 214), as shown in FIGS. 5 and 8, can channel air through one or more ducts that can be in thermal communication with the heat sink.

The frame of the chassis (100, 200) is preferably metal, though other materials are contemplated. In a preferred embodiment, the chassis frame is constructed of aluminum or steel, which can provide both good thermal conductivity and protection from physical impacts. Portions of the system, such as the handles etc., can include material having lower conductivity, to protect nearby objects and/or persons from overheating and/or burning. In some embodiments, the frame is between three to ten millimeters in thickness. The plates of the chassis are preferably metal one to ten millimeters thick. The plates can be attached to the frame of the chassis by rivets or bolts. Alternatively, the frame and one or more plates can be constructed as a monolithic structure. An advantage of embodiments can be modularization of the chassis, which can facilitate fitting the systems in small spaces and accompanying other racks of unrelated electronic equipment. Other advantages can include protection of system controls from being damaged and/or inadvertently moved if the system is set on its side and/or impacted by persons or objects.

The chassis can include internal mounts for mounting computer and radio componentry within the chassis. The mounts can be shock mounts, including, for example, compressible dampeners and/or springs.

Figure 16:
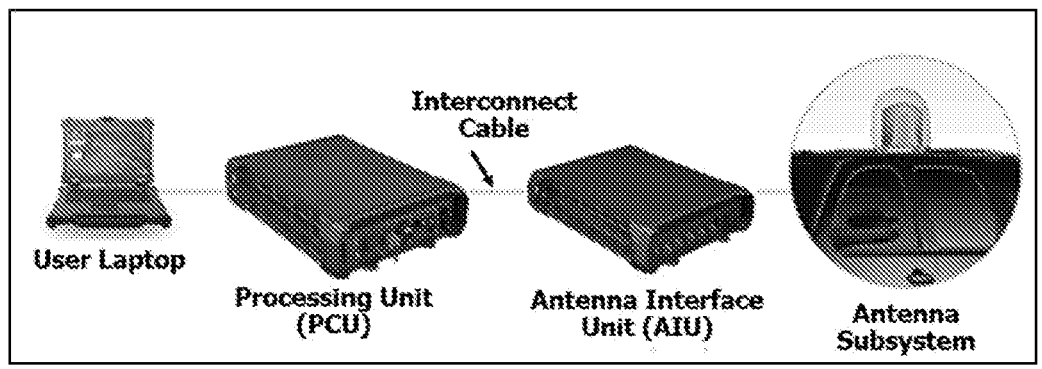
FIG. 16 illustrates an exemplary counter-unmanned aircraft system.

A C-sUAS can include non-kinetic, non-attributable (i.e., the origin of the countermeasures cannot be attributed to a specific location) countermeasures built upon a flexible software-defined radio (SDR) architecture to keep pace with the world's rapidly expanding sUAS threat environment. A C-sUAS embodiment is shown in FIG. 16. The C-sUAS can include subsystems such as an antenna subsystem, an Antenna Interface Unit (AIU), and interconnect cable, a Processor Control Unit (PCU), and a user interface, such as a laptop. The antenna subsystem can be installed, as shown, on the exterior of a vehicle, or it can be installed in the interior of a vehicle or even at a fixed site. The antenna subsystem can be connected to the antenna interface unit via RF cabling. The antenna interface unit can be connected to the processing unit through an interconnect cable. A laptop can be connected to the processing unit, for example by a standard Ethernet cable.

Embodiments can be deployed without impairment in high temperature and extreme vibration environments. The AIU and the PCU disclosed and described herein can meet and/or exceed environmental requirements of military standard MIL-STD-810G. For example, embodiments can meet temperature and humidity (0° C. to 60° C. and 5% to 95% humidity), rain (4" per hour), ice (½" accumulation), salt fog (48-hour exposure), shock and vibration (from rough road conditions and vessel-mounting), transit drop (transit case protection), and wind (100 mph).

All of the systems disclosed and claimed herein can be made and implemented without undue experimentation in light of the present disclosure. While the apparatus of this invention have been described in terms of preferred embodiments, it will be apparent to those of skill in the art that variations may be applied to the systems and apparatus described herein without departing from the concept, spirit and scope or the invention. In addition, from the foregoing it will be seen that this invention is one well adapted to attain all the ends and objects set forth above, together with other advantages. It will be understood that certain features and sub-combinations are of utility and may be employed without reference to other features and sub-combinations. This is contemplated and within the scope of the appended claims. All such similar substitutes and modifications apparent to those skilled in the art are deemed to be within the spirit and scope of the invention as defined by the appended claims.

The invention claimed is:

1. A chassis for housing electronic componentry, the chassis comprising:
   a chassis frame including a top plate and a bottom plate;
   an interface panel located on the chassis frame and disposed between the top plate and the bottom plate;
   a back panel located on the chassis frame opposite the interface panel, the back panel disposed between the top plate and the bottom plate;
   a protective protrusion located at a corner of the chassis frame and extending beyond the top plate and the bottom plate, the protective protrusion configured to protect the interface panel during transportation, installation, and operation of the chassis; and a cooling vent in one of the interface panel and the back panel, the cooling vent configured to channel air through the chassis.

2. The chassis according to claim 1, wherein the protective protrusion is configured to facilitate sliding the chassis into and out of a mounting rack.

3. The chassis according to claim 2, wherein a corner of the protective protrusion is faceted.

4. The chassis according to claim 1, wherein the chassis is configured to be mounted in one of a vertical position and a horizontal position.

5. The chassis according to claim 1, wherein the interface panel includes an interface connection configured to communicate with one of a processor control unit and an antenna interface unit.

6. The chassis according to claim 5, wherein the interface panel further includes a port for interfacing with a peripheral device.

7. The chassis according to claim 1, further comprising a shock mount configured to secure the chassis frame.

8. The chassis according to claim 1, further comprising a heat transfer device configured to dissipate heat from the chassis.

9. The chassis according to claim 1, further comprising an internal mount for mounting the electronic componentry within the chassis frame.

10. A multi-chassis system for housing electronic componentry, the multi-chassis system comprising:
a first chassis frame having a first top plate and a first bottom plate;
a first interface panel located on the first chassis frame and disposed between the first top plate and the first bottom plate;
a first back panel located on the first chassis frame opposite the first interface panel, the first back panel disposed between the first top plate and the first bottom plate;
a first protective protrusion extending beyond the first top plate and the first bottom plate, the first protective protrusion configured to protect the first interface panel;
a second chassis frame having a second top plate and a second bottom plate;
a second interface panel located on the second chassis frame and disposed between the second top plate and the second bottom plate, the second interface panel configured to be coupled to the first interface panel via a communication link;
a second back panel located on the second chassis frame opposite the second interface panel, the second back panel disposed between the second top plate and the second bottom plate;
a second protective protrusion extending beyond the second top plate and the second bottom plate, the second protective protrusion configured to protect the second interface panel; and
a wired communication link configured to carry communication signals between the first interface panel and the second interface panel, wherein the wired communication link is further configured to carry electric power from the first interface panel to the second interface panel.

11. The multi-chassis system of 10, wherein the first protrusion is configured to protect the first interface panel during transportation, installation, and operation of the multi-chassis system, and wherein the second protrusion is configured to protect the second interface panel during transportation, installation, and operation of the multi-chassis system.

12. The multi-chassis system of claim 11, wherein the second interface panel further comprises at least one of a first Wi-Fi antenna port, a second Wi-Fi antenna port, a high band antenna port, a low band antenna port, and a GPS antenna port.

13. The multi-chassis system of claim 11, wherein the first and second chassis frames further comprise internal mounts for mounting the electronic componentry within the respective chassis frames.

14. A method comprising:
providing a system comprising a processor control unit chassis operably coupled to an antenna interface unit chassis, the processor control unit chassis including a first interface panel and first electronic componentry, and the antenna interface unit chassis including a second interface panel and second electronic componentry;
detecting, via the system, an unmanned aircraft system entering restricted airspace; and
locating, via the system, the unmanned aircraft system based on the detecting step.

15. The method according to claim 14, further comprising identifying, via the system, the unmanned aircraft system based on the detecting step.

16. The method according to claim 15, further comprising mitigating, via the system, a threat of the unmanned aircraft system based on the detecting step, wherein the mitigating step includes delivering a non-kinetic, non-attributable signal.

17. The method according to claim 14, further comprising:
connecting the processor control unit chassis and the antenna interface unit chassis by a communication link;
carrying signals between the first interface panel and the second interface panel via the communication link; and
carrying electric power from the first interface panel to the second interface panel via the communication link, wherein the system is a counter unmanned aircraft.

18. The method according to claim 14, further comprising:
protecting the first electronic componentry by providing the processor control unit chassis with a first protective protrusion extending beyond the first interface panel, a first heat sink including first fins, a first heat pipe disposed inside the processor control unit chassis, and a first cooling vent;
protecting the second electronic componentry by providing the antenna interface unit chassis with a second protective protrusion extending beyond the second interface panel, a second heat sink including second fins, a second heat pipe disposed inside the processor control unit chassis, and a second cooling vent; and
securing the processor control unit chassis and the antenna interface unit chassis to an object via shock mounts.

* * * * *